United States Patent [19]

Nishizawa

[11] 4,371,412

[45] Feb. 1, 1983

[54] DRY ETCHING APPARATUS

[75] Inventor: Junichi Nishizawa, Sendai, Japan

[73] Assignee: Zaidan Hojin Handotai Kenkyu Shinkokai, Sendai, Japan

[21] Appl. No.: 166,700

[22] Filed: Jul. 3, 1980

Related U.S. Application Data

[60] Division of Ser. No. 924,066, Jul. 12, 1978, Pat. No. 4,233,109, which is a continuation-in-part of Ser. No. 759,120, Jan. 13, 1977, abandoned.

[30] Foreign Application Priority Data

Jan. 16, 1976 [JP] Japan .................................. 51-4469
Aug. 27, 1976 [JP] Japan ................................ 51-102825
Aug. 27, 1976 [JP] Japan ................................ 51-102826

[51] Int. Cl.³ .................... C23F 1/02; H01L 21/312
[52] U.S. Cl. ................................ 156/345; 156/657; 156/659.1
[58] Field of Search ............ 156/643, 646, 345, 657, 156/659.1; 250/531; 204/164, 192 E, 298; 427/39; 118/728

[56] References Cited

U.S. PATENT DOCUMENTS 4,123,316 10/1978 Tsuchimoto .................. 156/345 X
4,178,877 12/1979 Kudo ............................ 156/643 X

*Primary Examiner*—William A. Powell
*Attorney, Agent, or Firm*—Cushman, Darby & Cushman

[57] ABSTRACT

A radio frequency and a static electric field are superposedly applied to a low pressure gas to generate a gaseous plasma and to drive ions of selected polarity in a predetermined direction. The processing chamber is pre-evacuated to a sufficiently high vacuum, and an etching gas is introduced into the chamber to be rendered to a low pressure at which the mean free path of the ions is sufficiently long. The pressure of the etching gas may range from the order of $10^{-2}$ Torr to several Torr for etching silicon, using a silicon oxide as a mask material.

This method improves the treating accuracy, especially minimizes the amount of side etch, as compared with the conventional plasma etching, and reduces the surface damage when compared with the known ion beam etching.

8 Claims, 19 Drawing Figures

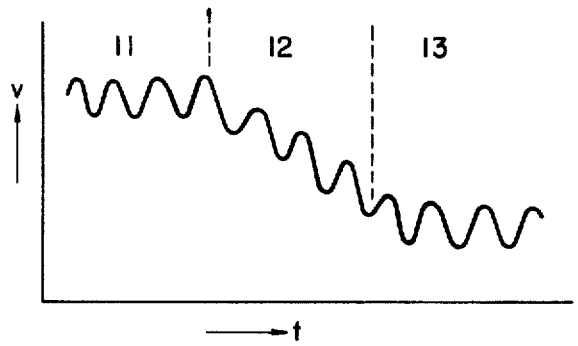
FIG. 4
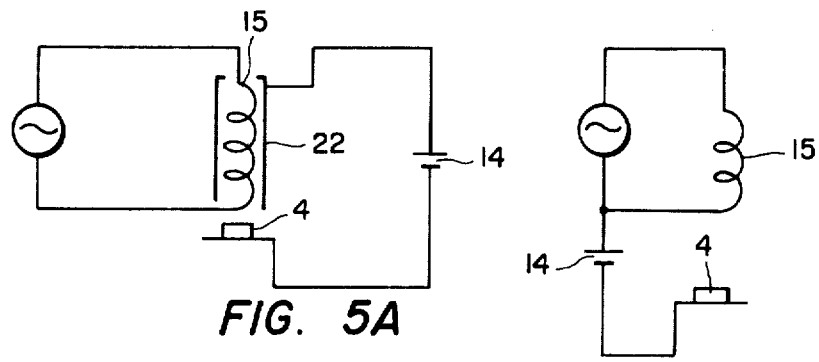
FIG. 5A
FIG. 5B
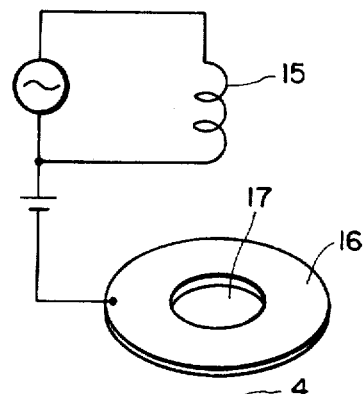
FIG. 5C

DRY ETCHING APPARATUS

CROSS-REFERENCE TO RELATED APPLICATIONS

This application is a division of my earlier application Ser. No. 924,066 filed July 12, 1978, and now U.S. Pat. No. 4,233,109, which in turn is a continuation-in-part of my earlier application Ser. No. 759,120 filed Jan. 13, 1977, now abandoned.

BACKGROUND OF THE INVENTION (a) Field of the invention:

The invention relates to a dry etching method and apparatus, and more particularly, it relates to an improved dry etching method and apparatus which utilize gaseous plasma and provides high precision etching.

(b) Description of the prior art:

Along with the advances and developments made of late in techniques in the integrated circuit designing field, higher precision is required in the manufacture of integrated circuits without being entailed by an increase in the manufacturing cost and yet allowing mass-production to be performed with no difficulty. Furthermore, the prevention and avoidance of pollution has been constituting a big problem that requires to be sloved. Under such circumstances, dry etching is attracting the attention of those concerned in view of its low-pollution and high precision properties.

The so-called dry etching techniques may be divided roughly into the following two types, i.e. the ion beam etching technique and the plasma etching technique. In the ion beam etching technique, an ion beam (including electron beam) is irradiated onto a specimen (target) in a high vacuum (usually the ambient pressure is less than $10^{-5}$ Torr) and physically sputters away the irradiated surface atoms. In case the radius of the ion beam is reduced by electronic lens system, a maskless etching can be performed by sweeping the ion beam on the specimen. In case positive ions are used as the etching agent, surface charge-up of the specimen can be prevented by neutralizing the accelerated or bombarded positive ions with electrons. Furthermore, ion beam etching allows accurate and directional etching to be achieved, since the etching agent collides with the target in one direction. However, the total etching rate in the case of the ion beam etching is rather low due to the fact that the diameter of the beam is small, and accordingly it is not possible to accomplish etching of a wide area easily. In addition, the surface which is subjected to sputtering by accelerated ion beam tends to become rough, and thus a damaged surface could be produced as a result of this etching. Therefore, the grade of finish of the resulting processed surface will low from the view point of the crystallographic and electronic properties. If the acceleration voltage is lowered in order to reduce the surface damage, the etching rate will decrease further.

On the other hand, plasma etching is being developed with a great rapidity. In this plasma etching technique, a specimen carrying a mask thereon is placed in a radio frequency plasma and is subjected to etching. Since an alternating electric field is used, the charge-up of the surface is neutrallized in each cycle. Plasma gas, in most cased, is chemically reactive to the material to be etched. For example, freon ($CF_4$) gas plasma may be used for etching silicon and silicon oxides, and oxygen ($O_2$) gas plasma may be used for etching photoresist films. The chemical reaction mechanisms have been debated but no decisive conclusion has been reached yet. Also, the role of neutral radical atoms in the reactive plasma etching is still in the stage of discussion.

Reactive plasma etching is regarded generally as a dry chemical reaction, and the optimum pressure of the plasma gas employed is usually of the order of $10^{-1}$ to $10^0$ Torr. At such a pressure, the mean free path is still very short, and electrons, ions, atoms (including radicals) and molecules (hereinafter they are generally referred to as component particles) repeat collisions and more randomly according to the Maxwell-Boltzmann distribution. Accordingly, component particles which are effective for etching cannot have high kinetic energy. As can be expected, such reactive plasma etching is almost isotropic in direction due to the random motion of the component particles. Thus, side etching does occur similar to the wet etching. Furthermore, the released atoms or molecules in the plasma etching technique may re-deposit on the specimen. If the pressure of the gas plasma is reduced for solving these problems, the etching rate will also be reduced. Furthermore, since the degree of vacuum (not pressure) employed for reactive plasma etching is considerably low (of the order of $10^{-1}$ to $10^0$ Torr), the effect of residual gas is not negligible. Also, even when ions of a certain polarity are effective for etching, and if those of the opposite polarity are harmful for some reasons or other, there indeed no way of preventing the reaction on the specimen by those ions having said opposite polarity, while utilizing those ions having said certain polarity required for etching.

SUMMARY OF THE INVENTION

Therefore, an object of the present invention is to provide a novel and improved dry etching method which is free from the above-described disadvantages and inconveniences of the conventional etching methods.

Another object of the present invention is to provide a method of etching in which the employed reaction gas in a plasma state is easily and selectively reacted upon workpieces that are to be treated.

A further object of the present invention is to provide a method of etching in which the yield, precision, uniformity and other characteristics of the processed products are improved greatly.

According to an embodiment of dry etching method of the present invention, the reaction gas employed is ionized into a plasma state and performs an etching reaction. The processing chamber is preliminarily evacuated high enough to remove the residual gas therefrom, and a reaction gas or gas plasma is introduced into the processing chamber. The reaction gas may be ionized by a radio frequency electric field and another static electric field, and/or magnetic field may be applied to the gas plasma so as to substantially utilize ions of a certain polarity. According to a further aspect of the present invention, the intensity of the additional electric or magnetic field may be varied with the progress of the processing.

These and other objects as well as the features and advantages of the present invention will become more apparent from the following description of the preferred embodiments when taken in conjunction with the accompanying drawings.

BRIEF DESCRIPTION OF THE DRAWINGS

FIG. 4 is a diagrammatic illustration of voltage waveform applied to the electrode in the apparatus of FIG. 2 according to another embodiment of the present invention.

FIGS. 5A to 5C are diagrammatic illustrations of the electric circuits to be used in embodiments of the present invention.

DETAILED DESCRIPTION OF THE PREFERRED EMBODIMENTS

Referring now to the accompanying drawings, the method of the present invention will be described in further detail.

Figure 1:
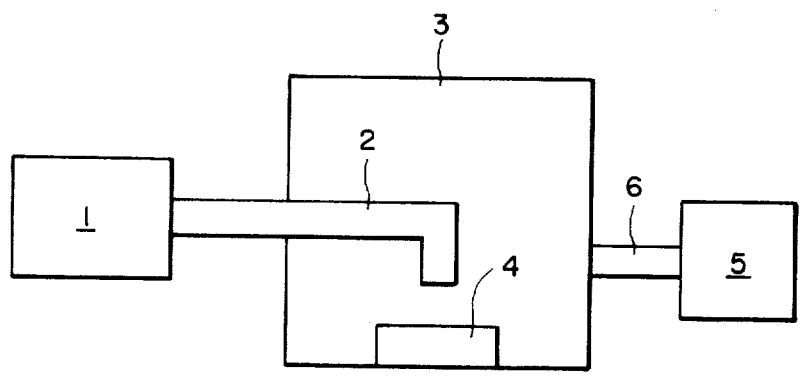
FIG. 1 is a diagrammatic illustration of an etching apparatus to help understanding of a basic concept of the method of the present invention.

FIG. 1 is a diagrammatic illustration of a dry etching apparatus for explaining the basic concept of the present invention. This apparatus comprises a plasma generator 1 which ionizes a reaction gas into a plasma state, a processing chamber 3 which contains a workpiece 4 to be processed, and an evacuating vacuum system 5. Apparently, a valve or valves may be provided to enable isolation of the plasma generator 1, the treating chamber 3, and the evacuating system 5.

The reaction gas fed from a gas supply source such as a gas cylinder (not shown) is ionized into a plasma state in the plasma generator 1 and it is then introduced into the chamber 3 through a nozzle 2. The plasma generator 1 may be disposed inside the processing chamber 3, and in such case the nozzle 2 may be disposed with. More particularly, the plasma generator 1 may be constructed by a quartz vessel, provided with a coil or plate electrodes usually on the outside thereof. A high-frequency electric voltage may be applied to the electords to establish a high-frequency electric field in the vessel and to ionize the reaction gas into a plasma state. The generated plasma is released into the processing chamber 3 through the nozzle 2. When the lifetime of the intended component particle is short, the plasma generator may be provided inside the treating chamber 3.

In the case of etching silicon (single crystalline or polycrystalline), or silicon compounds such as $SiO_2$ and $Si_3N_4$, a reaction gas, for example freon $CF_4$, is introduced into the plasma generator and it is changed into a plasma state.

The reaction gas plasma is then introduced into the processing chamber 3 through the nozzle 2. If desired, the nozzle 2 may be provided with a flow-controlling device such as a valve. In the processing chamber 3, a workpiece or workpieces 4 to be etched are placed at predetermined positions (on a supporting table). If the processing chamber is held at a low vacuum, the introduced component particles undergo numerous collisions and exert randomly distributed motions. On the other hand, if the processing chamber is held at a high vacuum, the introduced component particles keep linear motions. For achieving substantially linear motions of the component particles and for removing residual gas, the processing chamber 3 should be preliminarily evacuated to a high vacuum e.g. $10^{-4}$ Torr or higher, by the vacuum device 5 should be continuously evacuated at a predetermined pressure. When a high vacuum is maintained in the processing chamber 3, the component particles move substantially linearly, and they collide with the workpiece 4 substantially in one direction. The linear motion of these component particules becomes more distinct as the pressures of the residual gas and the introduced gas become lower. When the residual gas pressure can be neglected and the component particles of the introduced gas has a substantially uniform velocity, mutual collisions of the component particles of the introduced gas become negligible, and the workpieces will be hit by those component particles substantially in one direction. The pressure of the introduced gas can be controlled by manipulating a valve. The configurations of the inlet nozzle 2 and the evacuating system 5 can be appropriately changed or modified according to the intended purpose.

In short, when the pressures of both the residual gas and the introduced gas are reduced, the mean free path of the component particles becomes large and the frequency of collision of component particles becomes very low, thereby enabling improvement of precision of processing.

In case of etching a silicon substrate or a silicon compound by $CF_4$ gas plasma, a gaseous reaction product of $SiF_4$ is generated by the etching process, but it is evacuated immediately. The workpiece may be made of, for example, a metal such as Al, Mo and Au, compound semiconductors such as GaAs, GaP and InSb, photoresists, and organic substance such as insulating resin. Furthermore, the reaction gas may be, for example, one or a mixture of $CF_3Cl$, $C_2F_5Cl$, $C_2F_6$, $C_3F_8$, $Cl_2$, $Br_2$, $O_2$ and Ar. In the above-mentioned method, the direction of the motion of reaction particles is linear, and the reaction products are readily removed from the processing chamber 3, since the degree of vacuum in etching process is high. However, there is taken no countermeasure to remove any part of the component particles of the reaction gas. When some of the component particles is selectively introduced and utilized for the purpose of etching, there are provided remarkable advantages. Namely, since at least some of the component particles which are not required for etching are removed, the pressure of the introduced gas can be reduced to improve the linear motion of the component particles or otherwise the partial pressure of the component particles which are required for etching can be raised. Furthermore, when there is provided some energy-analyzing means, component particles of almost uniform velocity may be extracted into the processing chamber 3.

As disclosed above, the degree of vacuum employed in the processing chamber is made sufficiently high to reduce the collision number of the component particles of the introduced etching agent and to immediately exhaust the reaction products from the processing chamber. For example, the processing chamber may preliminarily be evacuated below $10^{-4}$ Torr and an etching gas may be introduced at a pressure of above about $10^{-3}$ Torr.

Figure 2:
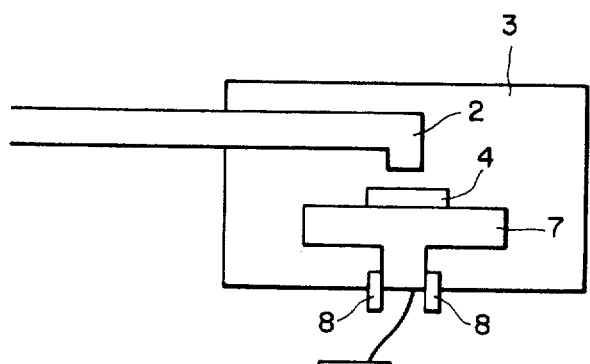
FIG. 2 is a diagrammatic illustration of an etching apparatus to be used for achieving an embodiment of the method of the present invention.

Description will be made on some preferred embodiments in which electric field and/or magnetic field are applied to an ionized gas plasma. FIG. 2 is a diagrammatic illustration of an apparatus used for carrying out an embodiment of the present invention in which an electric field is established in a processing chamber 3.

The reaction gas plasma is introduced into the processing chamber 3 through the nozzle 2. A workpiece 4 is held on a supporting table 7 which is electrically insulated by insulators 8 from the chamber wall. An electric voltage composed almost of a direct current component is applied to the supporting table 7 from an electric power source P. As a result of the DC electric field, ions of a certain polarity among those ions introduced into the processing chamber 3 are accelerated in the same direction and caused to collide with the workpiece 4 almost in said certain direction with a high kinetic energy.

In the case of utilizing negative ions, the workpiece 4 is applied with a positive voltage. Conversely, when positive ions are used, the workpiece 4 is applied with a negative voltage. By this method, a very sharp etching can be attained which has been impossible in the conventional plasma etching or liquid etching process.

Figure 3:
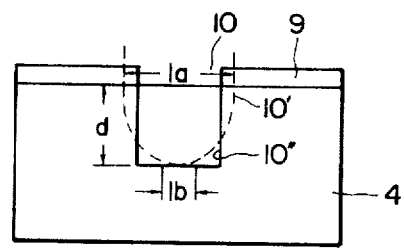
FIG. 3 is a diagrammatic enlarged cross-sectional view of a workpiece that has been processed according to an embodiment of the method of the present invention.

FIG. 3 is a diagrammatic cross-sectional view of a workpiece which is obtained according to this embodiment.

Etching is carried out by applying a mask 9 made of a suitable material to the surface of a workpiece 4. This mask 9 has an opening 10. For example, when silicon is etched, the surface of silicon is covered by $SiO_2$ and the opening 10 is selectively formed relying on the conventional phtolithographic technique. The silicon substrate under the opening 10 is then etched. Ions can be brought into collision with the surface of the workpiece 4 from a perpendicular direction so that the etching can be accurately performed precisely after a designed configuration as indicated by the solid line 10" in FIG. 3. In the drawing, the cross-section of a relatively precisely etched hole according to the conventional plasma etching is indicated by a dash line 10'. As will be understood from the drawing, in the case of a hole having a depth of 3 $\mu$m, the bottom size 1$b$ is seen to be smaller by 4–5 $\mu$m than the top size 1$a$ irrespective of the largeness of the top size 1$a$. According to the conventional plasma etching, even when the etching of intended dimensions can be attained near the surface of a workpiece, such dimensions would become smaller at deeper portions of the etched hole as compared with those of the surface portion. According to the etching method of the present invention, however, the dimensions of etched portions 10" at the surface is almost the same as those at the bottom. The etching accuracy relative to the opening 10 of a mask 9 can also be raised. Accordingly, the etching method of the present invention is quite suitable for fine processing.

In the device shown in FIG. 2, the workpiece 4 is placed on a table 7 in the processing chamber 3 and a DC voltage is applied between the table 7 and the wall of the chamber 3. In such case, the electric field established in the processing chamber 3 is uniform even near the surface of the specimen. For raising the uniformity of the electric field near the workpiece, it is preferable to adopt a pair of DC electrodes as will be discussed later.

In the etching of this embodiment described in connection with FIG. 2, a magnetic deflector similar to a mass spectrometer may also be used together with a electric voltage application device, so that specific ions having a certain kinetic energy are separated by electromagnets or permanent magnets, and the specific ions at a desired energy level are directed to the workpiece. In such instance, the reaction between the ions and the workpiece can be controlled as desired, and thus the efficiency, accuracy and uniformity of etching can be improved, and in addition, the reproducibility of the processing is also improved.

In accordance with the present invention, since the specific ions (in same modifications also at a certain energy level) can be directed toward the workpiece, those ions which are most reactive on the workpiece can be selected, and in addition, those ions which are least reactive on the material of the mask can also be selected. For example, when silicon is subjected to etching with a mask made of $SiO_2$ by using $CF_4$ gas, only negative fluorine ions which are considered reactive on the silicon may be used, while positive ions which are considered reactive on $SiO_2$ may be removed. Accordingly, with the combination of suitable ions and a masking material, etching can be performed causing neither an undercut of the workpiece nor an erosion of the mask. The selection of ions can naturally be changed by inverting the polarity of the applied electric voltage.

Furthermore, the workpiece can be etched selectively without the use of a mask by scanning specific ions of a certain energy which are selected through the method as stated above. Exemplified as the scanning for selective etching are:

a. Ions are scanned by applying electric voltage to electrostatic deflection plates.

b. The workpiece is precisely moved by, for example, mechanical or electromagnetic method.

c. Ions are scanned relative to the workpiece by combining the methods of above-mentioned (a) and (b).

Since it becomes unnecessary to cover up the unetched portions with a mask according to the above-stated method, selective etching becomes easier without the use of the photolithographic technique, so that not only the precision of etching but also the yield of etching can be improved.

When a mass spectrometer is used, an ion with mass-number M/ne (in which M indicates the mass of an ion, and ne indicates the charge on this ion where e is the electronic charge) can be selected. If collision in the middle of the way cannot be neglected, selection may also be performed on the velocity. In such case, the formation of spikes by the particles of a too large energy can be also prevented.

As described above, according to the etching method of the present invention, the degree of vacuum in the processing chamber containing a workpiece is raised prior to the processing, e.g. up to about $10^{-4}$ Torr of above, and continuous evacuation preferably is performed to keep a high vacuum, e.g. about $10^{-2}$ Torr.

Furthermore, the gas ions in the processing chamber is applied with an electric field with or without a magnetic field so as to remove needless gas ions, so that only those gas ions of a certain polarity useful for etching are brought into collision with the workpiece for reaction upon the workpiece in a single direction. Therefore, the efficiency and uniformity of etching are excellent, and desired precision etching can be attained. This etching may be performed by using only the gas ions necessary for etching, and if desired, only such gas ions as at a required energy level may be used. In the following, the etching method in which electric voltage or current containing AC and DC components will be described in detail.

In this etching method, ions are generated by applying electric currents in which DC power is combined with AC power. In the initial stage of etching, the DC component is made large, and it is gradually reduced with the lapse of time so that the etching is started at a large etching rate and that it is ceased at a relatively low etching rate in order to prevent the etched surface from being damaged or injured.

The waveform of AC power combined with DC power is shown relative to the lapse of time in FIG. 4. In the initial stage of the etching, the DC component is made large as shown in the portion 11 of FIG. 4. Accordingly, the etching rate can be made large in this portion and etching time can be saved.

As shown in the portion 12 of FIG. 4, the DC component is gradually reduced with the passage of time, and finally the electric current or voltage is decreased to a low value as shown in the portion 13 of FIG. 4, thereby preventing the etched surface from being damaged. In the portion 13, the DC component may be zero. For example, the etching is started at a DC voltage of 500 V in the portion 11, then the voltage is decreased from the portion 12 to the portion 13, and finally the etching is ceased at zero DC voltage. In other words, ion beam etching character is gradually decreased and transfers to plasma-like etching process.

Figure 5D:
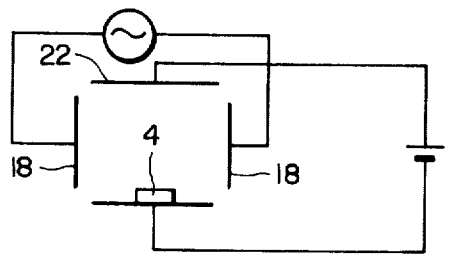
FIGS. 5D to 5G are diagrammatic illustrations of the electric circuits having a separate pair of electrodes for generating plasma.
Figure 5E:
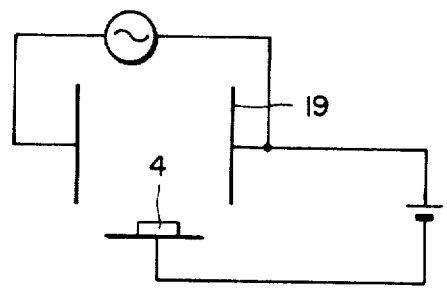
Figure 5F:
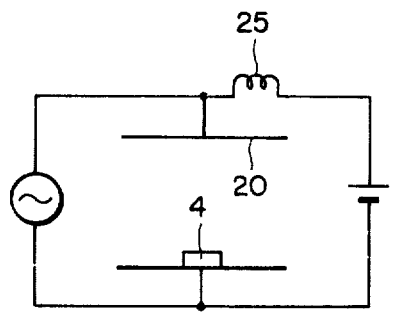
Figure 5G:
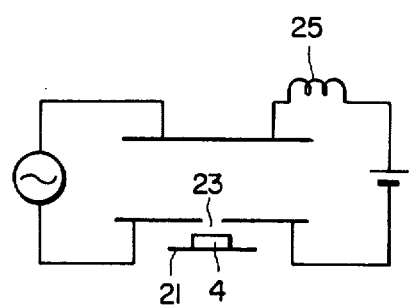

FIGS. 5A to 5C are diagrammatic illustrations of the apparatus which are used for carrying out etching of the present invention. In FIG. 5A, accelerating electrodes 22 are placed near an ionization coil 15 which is applied with a high frequency voltage. Between the electrodes 22 and the workpiece 4, a DC power source 14 is connected. Etching is started at a large DC voltage or current, and it is gradually decreased with the lapse of time, and the etching is finally ceased at a low DC electric voltage and current. The high frequency preferably is selected to be such a frequency at which the absorption by gas or gas plasma is high.

The apparatus shown in FIG. 5B has an ionization coil 15 which is also used as a DC electrode 22. This apparatus is advantageous in that the accelerating electrode 22 is not provided separately. In the apparatus shown in FIG. 5C, the acceleration voltage is not applied to the workpiece 4, but the apparatus is provided with an accelerating electrode 16 that has an aperture 17. The ions or plasma which are generated by the ionization coil 15 are accelerated through the aperture 17 of the accelerating electrode 16 and they are brought into collision with the workpiece 4. Therefore, this arrangement is advantageous in that the workpiece 4 is not applied with the accelerating electric field. Furthermore, the replacement of gas between the electrodes may be facilitated. Of course, in this apparatus of FIG. 5C, the accelerating electrode 16 and ionization coil 15 can be separated as those in the apparatus of FIG. 5A. Still further, in the examples of FIGS. 5A to 5C, a negative DC voltage is applied to the workpieces, but they can also be applied with a positive voltage. In the above examples, the ions necessary for the etching are selectively directed to the workpieces so that the processing efficiency is improved. Furthermore, the etching portions can be selected by changing the accelerating field from negative to positive or vice versa in the half way of the etching. Whether the workpiece is applied with a positive voltage or a negative voltage is determined according to the kinds of gases employed or to the material of the workpiece. This holds true throughout the following examples also.

In the apparatus shown in FIGS. 5D to 5G, a pair of electrodes are provided for generating ions in a plasma state. In the apparatus shown in FIG. 5D, plasma ions are generated by an AC field applied to the electrodes 18, and they are accelerated by an accelerating electrode 22 so as to be directed toward the workpiece 4. The electric voltage applied to the accelerating electrode 22 may be similar to that shown in FIG. 4 in which the DC component is gradually reduced just like the case of apparatus shown in FIGS. 5A to 5C. In the apparatus shown in FIG. 5E, an electrode 19 is used both for supplying DC and AC voltages. It is advantageous in that the number of electrodes can be decreased. In addition, the workpiece 4 is not applied with an Ac voltage. The apparatus shown in FIG. 5F has electrodes 20 which are applied with both DC and AC powers and the structure of the apparatus is made simple. An RF (radio frequency) rejecting inductance 25 is connected in series to the DC power source. In the apparatus shown in FIG. 5G, the workpiece 4 is not placed on an electrode, and accelerated ions from the aperture 23 of an electrode are directed to the workpiece 4. In this apparatus, an electric voltage is not applied to the workpiece 4. However, DC or AC voltage can be applied to the supporting table 21 which carries the workpiece 4.

Now, a more concrete embodiment adapted for mass-treatment will be described by referring to FIGS. 7, 8A to 8C and 9A to 9C.

Figure 7:
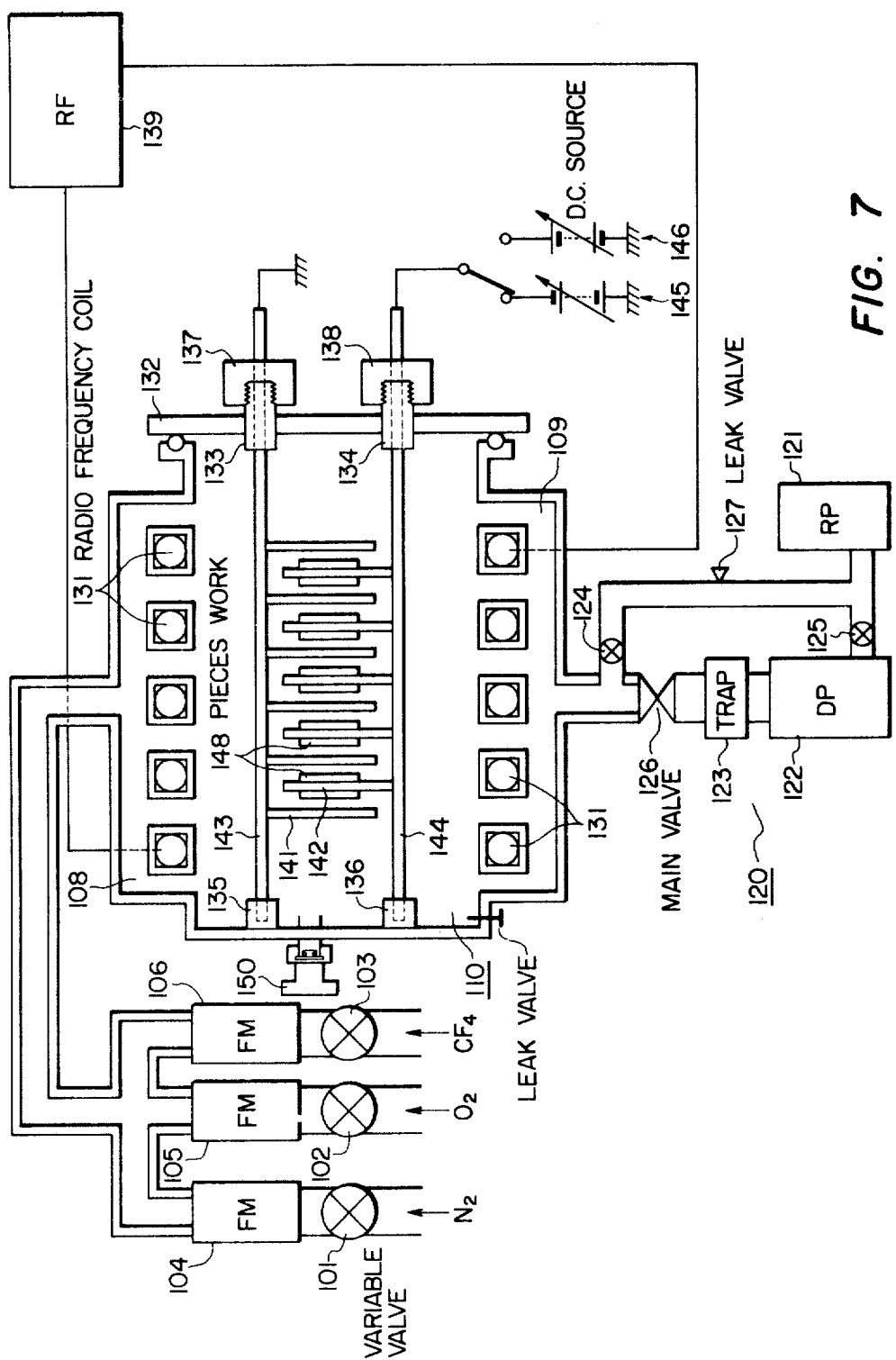
FIG. 7 is a diagrammatic representation of an etching system according to the present invention.

Referring to FIG. 7, three kinds of gases ($N_2$, $O_2$ and $CF_4$) are selectively supplied through respective valves 101, 102 and 103, and flow meters 104, 105 and 106. Thus, a selected gas or a gas mixture is supplied to a gas inlet cell 108 coupled to one side of a processing chamber 110 at a controlled flow rate. An evacuating system 120 including a rotary pump 121, a diffusion pump 122, a trap 123, valves 124, 125 and 126 and a leak valve 127, is connected to a gas outlet cell 109 coupled to the other side of the processing chamber 110. An RF (radio frequency) coil 131 is wound around the processing chamber 110 and connected to an RF power source 139 which provides an output power of several hundred watts at 13.56 MHz. Two groups of parallel electrodes 141 and 142 mounted on supporting rods 143 and 144 are positioned in the processing chamber 110 and applied with a DC voltage from a variable (500 volts maximum) DC voltage source 145 or 146. The gas pressure in the processing chamber is monitored by a vacuum gauge 150.

The number of the kinds of gases employed is not limited to three, but it can be arbitrarily varied according to the intended etching. The mixture gas preferably is arranged to cause a turbulence flow in the gas inlet cell 108 so as to be mixed and distributed uniformly in the gas inlet cell 108. In the structure of FIG. 7, the gas flow which is introduced into the gas inlet cell 108 is directed to collide with the quartz wall surrounding a part of the RF coil 131 to cause a turbulence flow. The evacuating system 120 is shown to have a combination of a rotary pump 121 and a diffusion pump 122 provided with a liquid mitrogen trap 123. Apparently, any kind of evacuating system can be used in place of the shown one. Particularly, oil-free evacuating system may preferably be used for some special purposes in which oil contamination on the workpieces could cause severe problems. A DC electric field is established between each pair of plate electrodes 141 and 142. One group of plate electrodes 141 is mounted on the grounded support rod 143 and the other group of plate electrodes 142 is mounted on the other support rod 144 which is connected to the DC voltage source 145 or 146. The DC voltage source 145 provides a negative potential, and the other DC voltage source 146 provides a positive potential. An RF electromagnetic field is established in a main portion of the processing chamber 110 including the space in which DC electric field is established. Apparently, capacitor-type electrodes may be used in place of the RF coil 131.

Figure 8A:
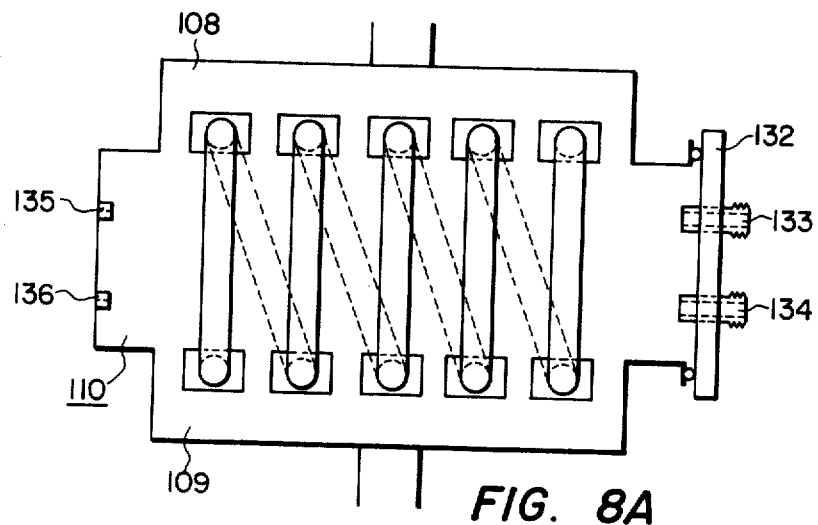
FIGS. 8A to 8C are diagrammatic representations of parts of the processing chamber, wherein FIGS. 8A and 8B indicate radio frequency coils, and FIG. 8C indicates a supporting member in the processing chamber.
Figure 8B:
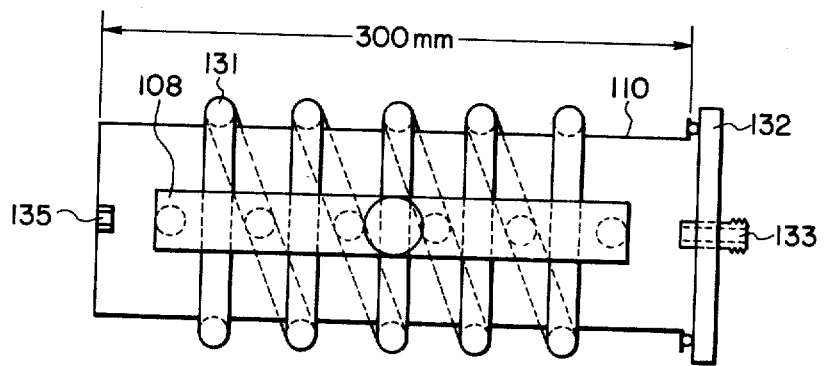
Figure 8C:
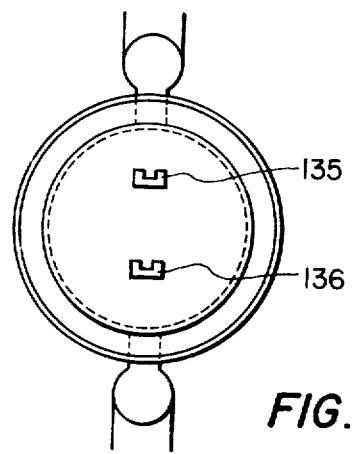

The processing chamber 110 is shown in FIGS. 8A to 8C in further detail. A single-ended quartz tube having a diameter of about 100 mm $\phi$ and a length of about 300 mm forms the wall of the processing chamber 110. The gas inlet cell 108 is also formed with quartz wall, and is provided on an upper portion of the processing chamber 110 (see FIGS. 8B and 8C). The gas outlet cell 109 has a shape similar to that of the gas inlet cell 108, and is provided on a lower portion of the processing chamber 110. There are provided a plurality of interconnecting holes between the processing chamber 110 and the gas inlet and outlet cells 108 and 109. The structure and the positions of the gas inlet and outlet cells can be varied according to the desired operation. For example, the gas inlet cell 108 may be provided on a lower portion of the processing chamber 110, whereas the gas outlet cell 109 may be provided on an upper portion of the processing chamber 110.

Figure 9A:
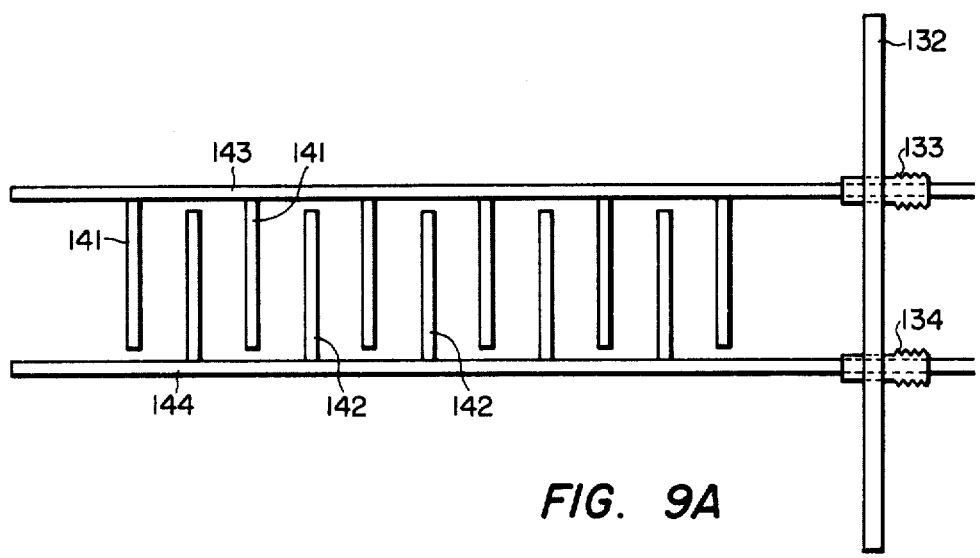
FIGS. 9A to 9C are diagrammatic representations of plate-electrodes and rods for supporting electrodes.

The open end of the processing chamber 110 is sealed with a stainless flange 132 provided with a pair of ceramic-insulated guide portholes 133 and 134 for allowing the passage of the support rods 143 and 144 (see FIG. 9A). On the inner wall of the closed end of the processing chamber 110, there are provided a pair of seats 135 and 136 which receive the free ends of the support rods 143 and 144.

Figure 9B:
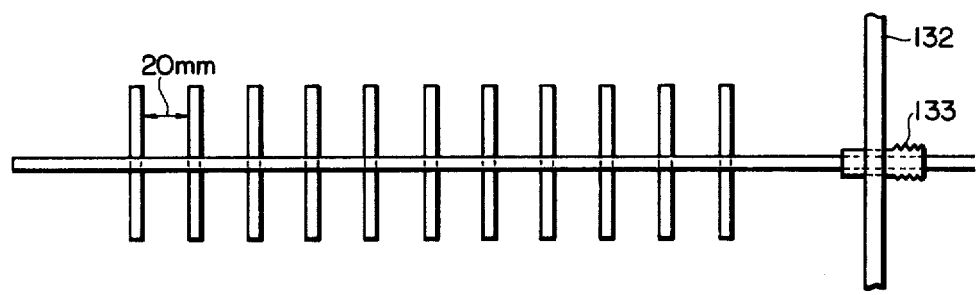
Figure 9C:
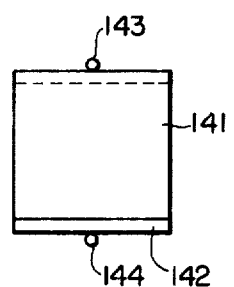

Referring to FIGS. 9A to 9C, a plurality of stainless steel plate electrodes 141 is connected to the stainless steel support rod 143, and a plurality of stainless steel plate electrodes 142 are connected to the stainless steel support rod 144. In this case, each of the plate electrodes 141 and 142 has dimensions of 60 mm × 60 mm for accomodating 2-inch wafers as shown in FIG. 7. The distance between adjacent pair of electrodes 141 or 142 connected to one support rod is selected to be about 40 mm. Thus, the distance between each pair of electrodes 141 and 142 is adjustable between 0 mm to about 40 mm by the relative translation of one support rod with respect to the other. The support rods 143 and 144 can be hermetically sealed and fastened by Teflon lock nuts 137 and 138. The constituents of the stainless steel, especially of the electrodes 141 and 142 are preferably selected to be fairly resistive against the etching.

Upon loading and retrieving the workpieces 148, the stainless steel flange 132 with the support rods 143 and 144 is dismounted from the processing chamber 110. Then, the lock nuts 137 and 138 and loosened, and the electrodes 141 and 142 are rotated to appropriate positions.

According to the above-described structure, ten 2-inch wafers can be processed in a single batch.

Figure 6:
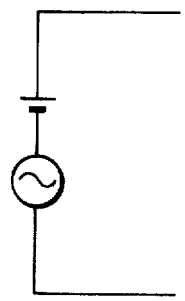
FIG. 6 is a circuit diagram of electric power sources in which an AC power source and a DC power source are connected in series.

In the above examples, the AC power source and DC power source are connected in parallel. They may also be connected in series as shown in FIG. 6.

By using the devices as shown in FIGS. 5A to 5G, the gas etching of the present invention can be successfully carried out when the electric voltage or current as shown in FIG. 4 is applied, in which the DC component is reduced with the passage of time. When the electric voltage or current is varied, a smaller electric voltage or current can be applied prior to the portion 11 of FIG. 4. The changes of electric voltage or current may also be arranged in such manners that only in a final small period, the DC electric voltage or current is decreased in magnitude and that the DC component can be varied discontinuously and stepwise.

The surfaces of workpieces which are etched according to the method of the present invention, sustain very few damages nor rejectable defects. Furthermore, it is very advantageous that the time required for the etching process can be reduced as compared with the conventional methods, since the etching rate in the initial step is made large. Thus, this etching method is very effective in the improvement of characteristics, increasing of yield and shortening of processing time. Still further, in the etching method in which only the necessary gas or ions are used and an electric field and/or magnetic field is applied so as to direct the selected gas ions toward workpieces, the efficiency of processing, as well as the uniformity and orientation of working can be improved and excellent accuracy relative to the designed configurations can be attained. In addition, the workpiece may be bombarded with a fine ion beam narrowed by an electric or magnetic field with the relative movement of the workpiece and the ion beam. In such case, the workpiece can be selectively etched without the use of a mask, which is another feature of the present invention.

Furthermore, according to the above-described embodiments of the present invention, the AC voltage for the generation of a plasma is combined with a DC component, and positive or negative ions are selected, so that the etching rate can be increased by accelerating the positive or negative ions, and the etched surfaces of the workpieces are prevented from being damaged by decreasing the DC component with the lapse of time. Thus, the etching rate can be raised with small side etch effect and the etching time can be shortened as compared with the conventional methods. The face that the surface property of the etched workpieces is improved is quite effective in view of improving the characteristics of products and the yield.

From the above disclosure, it will be understood that the present invention is able to improve not only the accuracy, efficiency and yield of etching by realizing effective, uniform and accurate processing, but also the crystallographic and electronic characteristics of etched products.

Although the present invention has been described in connection with preferred embodiments thereof, many variations and modifications will now become apparent to those skilled in the art. Therefore, the present invention is not limited to the specific disclosure herein made, but it is limited only by the scope of the appended claims.

What is claimed is:

1. A dry etching apparatus comprising:
   a hermetic processing chamber formed with a material inactive on a plasma gas;
   a pair of electrode groups for applying a DC voltage therebetween, each group including a plurality of electrode plates, the electrode plates of respective groups being disposed alternately to form a plurality of parallel electrodes;
   two supporting rods for supporting said respective groups of electrode plates, at least one of said rods being slidable along and rotatable about its axis;
   a DC electric source connected between said pair of electrode groups for applying a DC voltage therebetween;
   a RF coil and a RF power source for exciting a plasma gas;
   a plurality of gas inlets formed through said hermetic processing chamber along the axis of said supporting rod for introducing a gas for generating a plasma gas substantially parallel with said electrode plates.

2. The dry etching device according to claim 1, wherein: said hermetic processing chamber is formed with quartz.

3. The dry etching device according to claim 1, wherein: said parallel electrodes are formed with stainless steel plates.

4. The dry etching device according to claim 1, wherein: said parallel electrodes are adopted for mounting a plurality of workpieces on either or both surfaces of said electrodes.

5. The dry etching device according to claim 1, further comprising means for evacuating the interior of said hermetic processing chamber.

6. The dry etching device according to claim 1 wherein one group of said electrodes is given a ground potential and the other group of electrodes is given a voltage different from said ground potential.

7. The dry etching device according to claim 1, wherein said DC electric source supplies a DC voltage of either polarity.

8. The dry etching device according to claim 7, wherein said DC electric source supplies a DC voltage of variable magnitude.

* * * * *